United States Patent
Matsui

(10) Patent No.: US 7,187,432 B2
(45) Date of Patent: Mar. 6, 2007

(54) HOLDING SYSTEM, EXPOSURE APPARATUS, AND DEVICE MANUFACTURING METHOD

(75) Inventor: Shin Matsui, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 198 days.

(21) Appl. No.: 10/987,148

(22) Filed: Nov. 15, 2004

(65) Prior Publication Data

US 2005/0128462 A1    Jun. 16, 2005

(30) Foreign Application Priority Data

Nov. 18, 2003    (JP)    ............................. 2003/388129

(51) Int. Cl.
*G03B 27/58*    (2006.01)
(52) U.S. Cl. .......................................... 355/72; 355/75
(58) Field of Classification Search ..................... None
See application file for complete search history.

(56) References Cited

U.S. PATENT DOCUMENTS

| | | | |
|---|---|---|---|
| 5,191,218 A | 3/1993 | Mori et al. | 250/453.11 |
| 5,854,819 A | 12/1998 | Hara et al. | 378/34 |
| 5,883,932 A | 3/1999 | Chiba et al. | 378/34 |
| 5,999,589 A | 12/1999 | Chiba et al. | 378/34 |
| 6,172,738 B1 | 1/2001 | Korenaga et al. | 355/53 |
| 6,381,005 B1 | 4/2002 | Kasumi et al. | 355/75 |
| 6,404,505 B2 | 6/2002 | Matsui | 356/620 |
| 6,862,080 B2 | 3/2005 | Matsui | 355/72 |
| 2005/0052634 A1* | 3/2005 | Sugihara et al. | 355/55 |

FOREIGN PATENT DOCUMENTS

JP    10-97985    4/1998

* cited by examiner

*Primary Examiner*—D. Rutledge
(74) *Attorney, Agent, or Firm*—Fitzpatrick, Cella, Harper & Scinto

(57) ABSTRACT

A holding system for holding an object from above, against gravity. The holding system includes at least one holding portion adapted to be in contact with the object, to hold the object from above, at least one attracting portion for attracting a limited portion of the object upwardly, without contact thereto, and a gap measuring unit for measuring a gap between the object and the at least one attracting portion. The attraction force of the attracting portion is controlled on the basis of the measurement made by the gap measuring unit.

4 Claims, 6 Drawing Sheets

HOLDING SYSTEM, EXPOSURE APPARATUS, AND DEVICE MANUFACTURING METHOD

FIELD OF THE INVENTION

This invention relates generally to a holding technique for holding an object and, more particularly, to a holding system usable in an exposure apparatus for a lithographic process in the manufacture of circuit devices, such as semiconductor devices or liquid crystal display devices, for holding a reflecting optical element, for example.

The manufacture of semiconductor devices currently uses a step-and-scan type scanning exposure apparatus in which ultraviolet pulse laser light having a wavelength of 248 nm from a KrF excimer laser light source or an ultraviolet pulse laser light having a wavelength of 193 nm from an ArF excimer laser light source is used as illumination light, and wherein a mask or reticle (hereinafter, simply "reticle") having a circuit pattern formed thereon and a wafer (photosensitive substrate) are one-dimensionally scanningly moved relative to the projection filed of a reduction projection optical system, whereby the circuit pattern as a whole is transferred to a single shot region on the wafer. Such a scan exposure operation is followed by stepwise motion, and these operations are repeated.

It is certain that the density of a semiconductor device is in the future raised more and more, and the device rule would not be greater than 0.1 im, that is, 100 nm L/S (line-and-space). There are many technical problems to be solved, to meet this requirement by use of an exposure apparatus in which ultraviolet pulse laser light having a wavelength of 193 nm is used as illumination light.

In recent years, extreme ultraviolet (EUV) exposure apparatuses using light in a soft X-ray region of a wavelength of 5 nm–15 nm (hereinafter, this light will be referred to as "extreme ultraviolet light" or "EUV light" in this specification) have been developed, and they have become attractive as next generation exposure apparatuses or a minimum linewidth of 100 nm.

Such an EUV exposure apparatus must be placed in a vacuum ambience, and the optical system has to be a reflection optical system, as contrasted to conventional exposure apparatuses.

Furthermore, as regards the precision, extremely strict precision is required with respect to reticle-to-wafer alignment precision, wafer positioning precision, including stepping precision, distortion and focus of the projection optical system, and so on.

As regards the reticle structure, in dependence upon the number of mirrors of a reflection type projection optical system, it would be necessary that the mask be supported upside down. Furthermore, because of vacuum ambience, vacuum attraction is inappropriate, and electrostatic attraction has to be used to hold a reticle or a wafer. On the other hand, in regards to the precision of the surface shape of the reticle, a strict precision of a nm level is unexceptionally applied thereto. Additionally, correction of an error is very difficult to achieve.

When an electrostatic attraction force is used in a vacuum ambience to hold a reticle from above, with a pattern bearing surface (reflection surface) of the reticle held facing down, the following inconveniences are caused: (1) if a reticle is supported at three or four points along its periphery, self-weight flexure will be produced which, in turn, will cause defocus of a non-negligible amount; (2) as compared with a conventional transmission type reticle, a reflection type reticle can be held by gripping the back surface thereof, but when the back surface as a whole (containing a surface-step structure) is gripped, and, if there is a foreign particle sandwiched, it causes surface strain and defocus, as well; and (3) since the electrostatic chuck itself generates heat, due to thermal expansion of the chuck, a deviation is produced between the chuck and the reticle.

SUMMARY OF THE INVENTION

It is accordingly an object of the present invention to provide a holding technique by which at least one of the inconveniences described above can be solved or reduced.

It is another object of the present invention to provide a holding technique by which the shape of an object to be held can be controlled.

In accordance with an aspect of the present invention, to achieve at least one of the objects described above, there is provided a holding system for holding an object from above, against gravity, the holding system comprising at least one holding portion adapted to be in contact with the object, to hold the object from above, and at least one attracting portion for attracting a limited portion of the object upwardly, without contact thereto.

Thus, according to the present invention, a holding technique by which the shape of an object to be held can be controlled, is provided.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
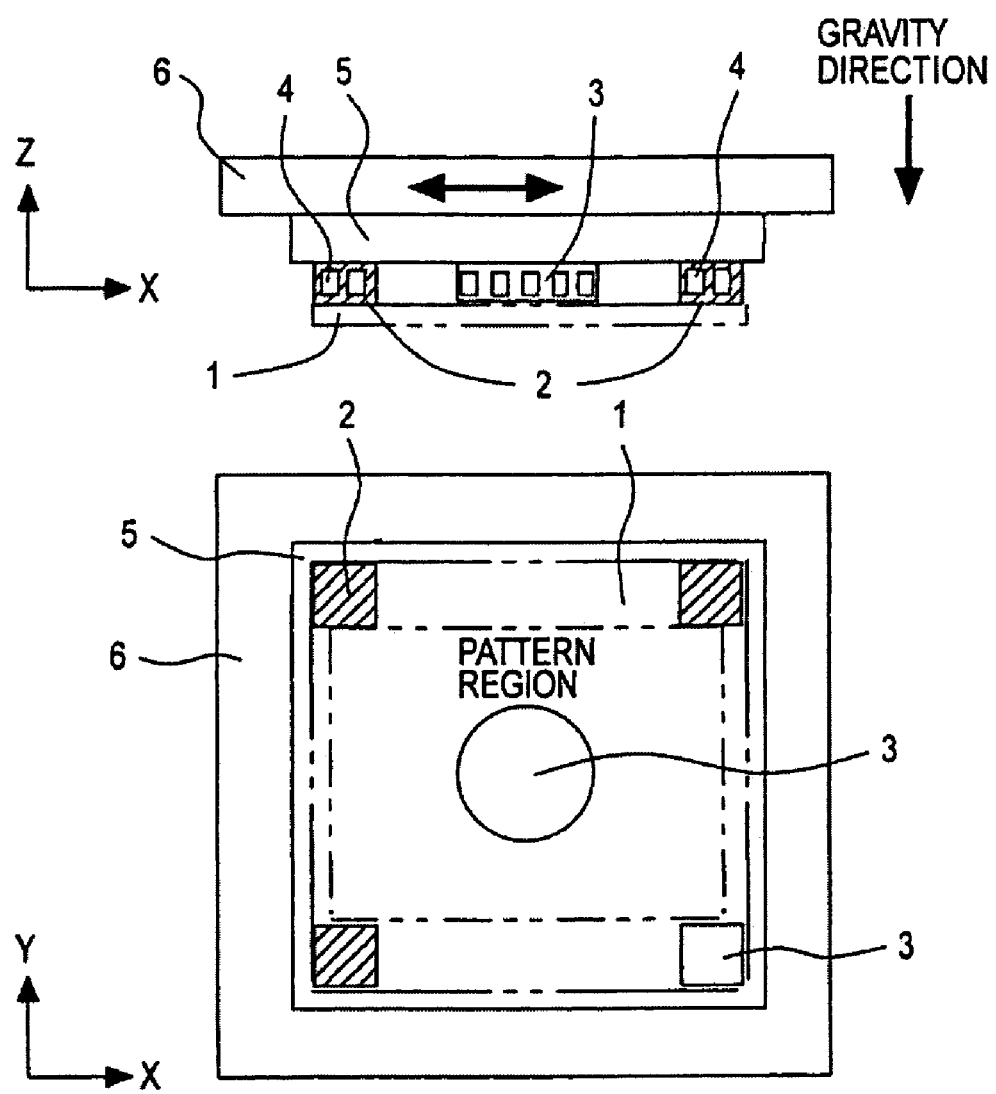
FIG. 1 is a schematic view of a general structure of a reticle chuck according to an embodiment of the present invention.

In accordance with one preferred embodiment of the present invention, the object to be held is supported at least at one point and, additionally, in a region other than this, at least one electrostatic chuck is provided without contact to the object. The electrostatic chuck provided in non-contact (hereinafter, "non-contact electrostatic chuck") is arranged to partially deform the shape of the object by its attraction force, without contact to the object.

Another preferred embodiment of the present invention concerns a substrate holding system for holding a substrate, wherein the substrate is supported at at least one point, preferably, at three points, and, in a region of the substrate other than this portion, at least one electrostatic chuck is provided without contact to the substrate. The holding means for holding the substrate at the three points preferably comprises one of electrostatic attracting means, vacuum attracting means, electromagnetic attracting means and mechanical gripping means.

In one preferred form of the present invention, the non-contact electrostatic chuck has a function for correcting self-weight flexure of the substrate by its attraction force, without contact to the substrate.

In one preferred form of the present invention, the non-contact electrostatic chuck has a function for partially deforming the shape of the substrate by its attraction force, without contact to the substrate.

In one preferred form of the present invention, a plurality of non-contact chucks are preferably provided, each being the non-contact chuck as described above.

The clearance between the non-contact chuck and the substrate may preferably be 20 im or less, more preferably, not greater than 5 im.

The non-contact chuck may preferably have a temperature adjusting function.

In one preferred form of the present invention, the non-contact electrostatic chuck is provided with gas measuring means for measuring the gap between the chuck and a reticle.

In one preferred form of the present invention, a control system is provided to feed back a measured value of the gas measuring means to the attraction force of the non-contact electrostatic chuck.

In a substrate holding system for holding a substrate according to one preferred form of the present invention, height measuring means is provided to measure the height (level) of the substrate.

In one preferred form of the present invention, the attracting force of the non-contact electrostatic chuck is changed in accordance with a measured value of the height measuring means.

The substrate may be a reflection type reticle having a circuit pattern formed on a glass substrate. The substrate holding at three peripheral points may be attained by an electrostatic chuck and, preferably, the reticle is held at its bottom face outside the pattern region on the pattern bearing surface.

In one preferred form of the present invention, a base plate to which the non-contact electrostatic chuck is fixed is made of a low thermal expansion material.

Preferably, the base plate is made of the same material as that of the reflection type mask having a circuit pattern formed on a glass substrate.

The material of the base plate may preferably be ceramics or glass, having a linear expansion coefficient of $10^{-6}$ or less.

The base plate may preferably have temperature adjusting means provided inside thereof.

The electrostatic chuck for the three-point support may be fixed through a base plate made of the same material as that of the mask or of a low thermal expansion material, rather than constituting it as an integral member. On that occasion, with respect to the thermal expansion, the material of the electrostatic chuck need not be a particular one. This leads to a reduction of cost for production of the electrostatic chuck.

Another preferred embodiment of the present invention concerns a mirror holding system for holding a mirror, wherein the mirror is supported at least at one point, preferably, at three points, and, wherein, in a region of the substrate other than that portion, at least one electrostatic chuck is provided without contact to the mirror.

Next, with reference to the attached drawings, preferred embodiments of the present invention will be described specifically and in detail.

Embodiment 1

A first embodiment of the present invention will be explained in conjunction with FIGS. 1–3.

Figure 2:
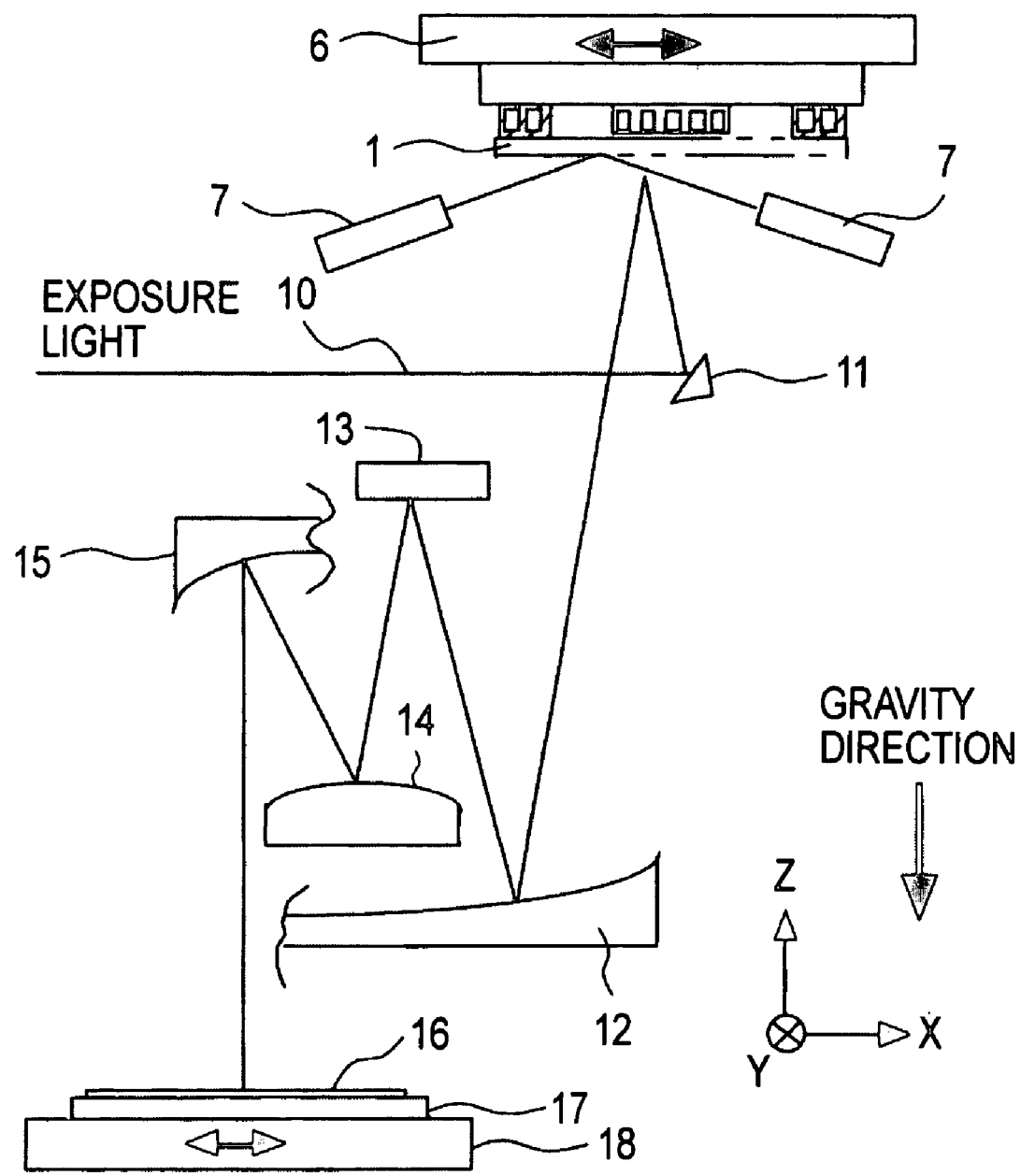
FIG. 2 is a schematic view of a general structure of an exposure apparatus into which the reticle chuck of FIG. 1 is incorporated.

FIG. 1 illustrates a general structure of a reticle chuck according to a first embodiment of the present invention. FIG. 2 is a schematic view of a general structure of an exposure apparatus as a whole, including the reticle chuck of FIG. 1.

The general structure of the exposure apparatus will be described first, with reference to FIG. 2.

The exposure apparatus shown in the drawings is a projection exposure apparatus which uses, as exposure light, light in a soft X-ray region having a wavelength of 5 nm to 15 nm, for example, EUV exposure light 10 having a wavelength of 13.4 nm or 11.5 nm, and it is arranged to perform an exposure operation in accordance with a step-and-scan method. The exposure light 10 coming along the X direction in the drawing is reflected by a mirror 11, and it is projected onto a reflection type reticle 1 having a circuit pattern formed on a glass substrate. Although the reflection type reticle will be described later in detail, it is attracted and gripped by an electrostatic chuck, also to be described later. The reticle is placed on a reticle stage, not shown, which is movable in the X direction in the drawing and is minutely movable with all degrees of freedom (i.e., in six axis directions).

The exposure light reflected by the reflection type reticle 1 is projected to a reflection projection optical system. This reflection projection optical system comprises a first mirror 12, a second mirror 13, a third mirror 14 and a fourth mirror 15. The exposure light reflected by these mirrors is transferred to the wafer 16.

Here, the first and fourth mirrors 12 and 15 have a reflection surface of an aspherical surface shape. The second mirror 13 has a flat reflection surface, and the third mirror 14 has a reflection surface of a spherical surface shape. As a matter of course, the present invention is not limited with respect to the structure of the reflection projection optical system. In each reflection surface, a work precision of about 1/50 to 1/60 of the exposure wavelength is accomplished with reference to the design value. Thus, in terms of RMS value (standard deviation), the error will be only 0.2 nm to 0.3 nm. The material of each mirror is low-expansion glass or metal. On the surface of each mirror, there is a reflection layer to EUV light that comprises a multilayered film, which may be alternately superposing two different materials, as with the reflection type reticle 1.

Denoted at 17 is a wafer chuck for supporting the wafer 16, and it holds the wafer 16 through an electrostatic attracting force. Denoted at 18 is a wafer stage base for supporting the wafer chuck 17. The wafer stage base is supported by a wafer stage (not shown), which is movable in horizontal directions (X and Y directions) and also is minutely movable with all degrees of freedom (i.e., in six axis directions).

This exposure apparatus is arranged so that an image of a portion of a circuit pattern formed on the reflection type reticle (mask) 1 is projected onto the wafer (substrate) 16 through the reflection projection optical system 12–15, while, on the other hand, the reflection type reticle and the wafer 16 are relatively scanningly moved in a one-dimensional direction (the X-axis direction, in this example) relative to the projection optical system 12–15, whereby the entirety of the circuit pattern of the reflection type reticle 1 is transferred to each of different shot regions on the wafer 16 in a step-and-scan method.

Denoted at 7 is a focus sensor for measuring the position of the reflection surface of the reflection type reticle 1 with respect to the height direction (Z direction).

Referring back to FIG. 1, the structure around the reflection type reticle 1 will be explained. In FIG. 1, denoted at 1 is a reflection type reticle, and it has an electrically conductive film for electrostatic attraction, formed on the bottom face thereof. Denoted at 2 is a contact type electrostatic chuck for gripping the bottom face of the reflection type reticle 1 at three peripheral points, through an electrostatic attraction force. Denoted at 5 is an electrostatic chuck base for supporting the contact type electrostatic chuck 2. Denoted at 6 is a reticle stage base for supporting the electrostatic chuck base 5. The reticle stage base is supported by a reticle stage (not shown), which is movable in the X direction (scan direction) and also is minutely movable with all degrees of freedom (i.e., in six axis directions).

Here, the electrostatic chuck base 5 is made demountably mountable to the reticle stage base 6. As regards the material of the electrostatic chuck base 5, preferably, it may be made of the same material as that of the reflection type reticle 1 or made of ceramics or glass having a low thermal expansion coefficient (e.g., not greater than $1 \times 10^{-6}$), so as to prevent chucking shift due to heat generation of the chuck itself or heat generation by exposure.

In this embodiment, the reticle 1 is gripped at three peripheral points by the contact type electrostatic chuck 5. However, the number of gripping points is not limited to this. It may be gripped at a single point.

It is seen from the drawing that reticle 1, electrostatic chuck 2, electrostatic chuck base 5 and reticle stage base 6 are disposed in this order along the counter-gravity direction.

Denoted at 3 is a non-contact type electrostatic chuck supported by the electrostatic chuck base 5. The non-contact type electrostatic chuck is arranged to be kept out of contact from the bottom face of the reflection type reticle 1, with a certain clearance maintained therebetween, when the reflection type reticle 1 is being gripped by the contact type electrostatic chuck 2. In a portion of the reflection type reticle 1, to be opposed to the non-contact type electrostatic chuck 3, there is an electrically conductive film formed. The non-contact clearance described above may preferably be not greater than 20 im in the state in which a desired flat reticle surface shape is accomplished. A clearance not greater than 10 im is much better. Both of the contact type electrostatic chuck 2 and the non-contact type electrostatic chuck 3 are provided with a temperature adjusting flowpassage 4 such that they can be temperature adjusted and controlled against the heat generation in the electrostatic chuck. The surface of the contact portions (depicted by hatching in FIG. 1) of the contact type electrostatic chuck 2 may be formed into a pin chuck structure of a ring chuck structure, wherein the surface is partially engraved.

In order to hold in practice the reflection type reticle 1 with the structure described above, the reticle 1 is conveyed by a reticle conveying system (not shown) and then it is electrostatically attracted and held by the contact type electrostatic chuck 2. In this state, the reticle 1 is supported by a three-point support, and flexure by its self weight is produced therein. Although it depends on the shape or supporting position, according to calculations, self-weight flexure of hundreds of nm may be caused by the three-point support. Since the exposure is made by use of a ring-like zone of exposure light, a small flexure around the Y axis may be corrected to some degree by the reticle stage (not shown). As regards flexure around the X-axis direction, however, since it leads to defocus at the long-span side of the ring, it cannot be corrected by the reticle stage 6.

In accordance with this embodiment, in consideration of it, the non-contact electrostatic chuck 3, being kept out of contact from the reflection type reticle 1, is arranged to produce an attracting force by which the reflection type reticle 1 is partially lifted upwardly to thereby correct flexure by the weight thereof. Of course, other than correction of the self-weight flexure, this structure may be used to intentionally cause deformation of the reflection type reticle to correct the shape precision of the reticle 1 or to cancel any strain of the optical system, for example. Because of the property of the electrostatic chuck, if the clearance is too large, no attracting force will be produced. If the clearance is not greater than several tens of microns, it is sufficiently possible to produce flexure of a glass substrate by a few microns, although the attracting force is slightly low as compared with direct contact. Furthermore, the non-contact electrostatic chuck is arranged to provide a variable attracting force.

Figure 3:
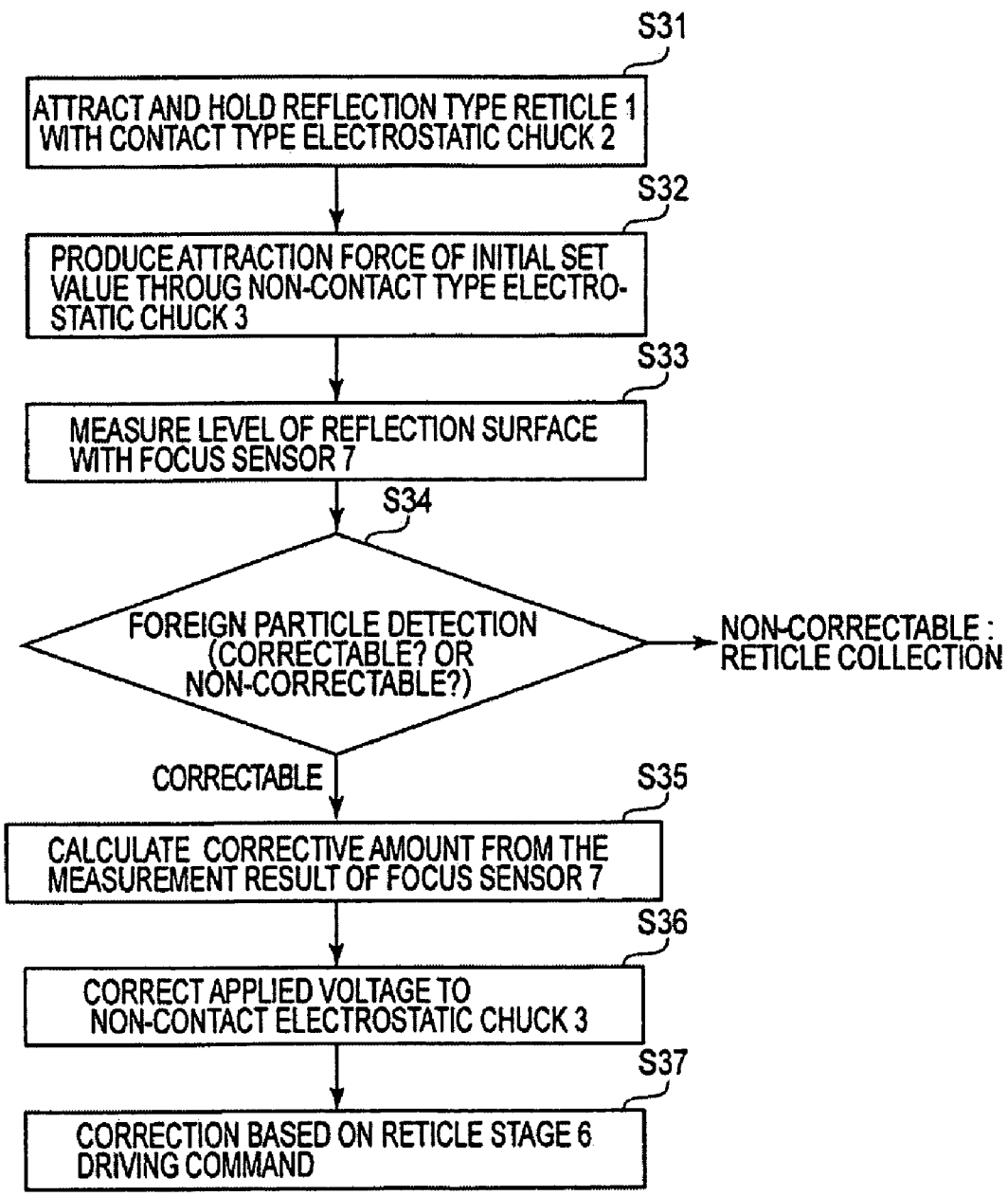
FIG. 3 is a flow chart for explaining a reticle correction sequence to be performed with the structure of FIG. 1.

Referring now to FIG. 3, showing the reticle correction sequence, the sequence up to gripping a reflection type reticle in an actual exposure apparatus will be explained.

First, a reflection type reticle 1 is attracted and gripped with the contact type electrostatic chuck 2. The amount of idealistic self-weight flexure in this state has been detected beforehand, in accordance with calculation or experiments. Then, the non-contact electrostatic chuck is operated to produce, as an initial value, an attracting force effective to cancel the self-weight flexure of the reticle. By producing an attracting force of this initial value, a largest flexure can be almost cancelled. Subsequently, the reticle stage 6 is scanningly moved in the X direction, and the height (level) of the reflection surface of the reticle 1 is measured by use of the focus sensor 7. At this stage, any residual error after the self-weight flexure is cancelled or a shape error of the reflection type reticle 1, for example, can be measured. Furthermore, if there is any foreign particle nipped at the contact type electrostatic chuck, contact-gripping the reticle, it can be detected by this measurement (it may be detected on the basis of leakage current of the contact type electrostatic chuck). If the presence of any particle is detected, the reticle may be collected to remove the particle or, alternatively, the influence of the particle may be cancelled by correction, the procedure being chosen in dependence upon the magnitude or quantity of the particle.

If no particle is detected or, although a particle is detected, it is concluded that it should be cancelled by correction, and respective correction amounts are calculated on the basis of the result of measurement described above. Here, a calculation may include correction of strain of the optical system, as well, for example. Subsequently, on the basis of the calculation, the applied voltage to the non-contact electrostatic chuck 3 is changed to correct the attracting force.

Finally, as regards the component to be corrected by the reticle stage 6, a corresponding signal is fed forward to a drive command for exposure scan, whereby correction is completed. The error to be corrected by the reticle stage may be mainly an error concerning average height or a wedge component.

Although, in this embodiment, the reflection type reticle 1 is gripped by contact through the contact type electrostatic chuck 2, the gripping method is not limited to this. For example, mechanical gripping or electromagnetic attraction gripping may be used, with similar advantageous effects. Furthermore, although, in this embodiment, the bottom face of the reflection type reticle 1 is gripped at three peripheral points by an electrostatic attraction force, the positions of these three points should preferably be at the bottom face, outside the reticle pattern region on the pattern bearing surface of the reticle. Of course, the support other than the three-peripheral-point support may be used, although the effect may be slightly lower.

Embodiment 2

Figure 4:
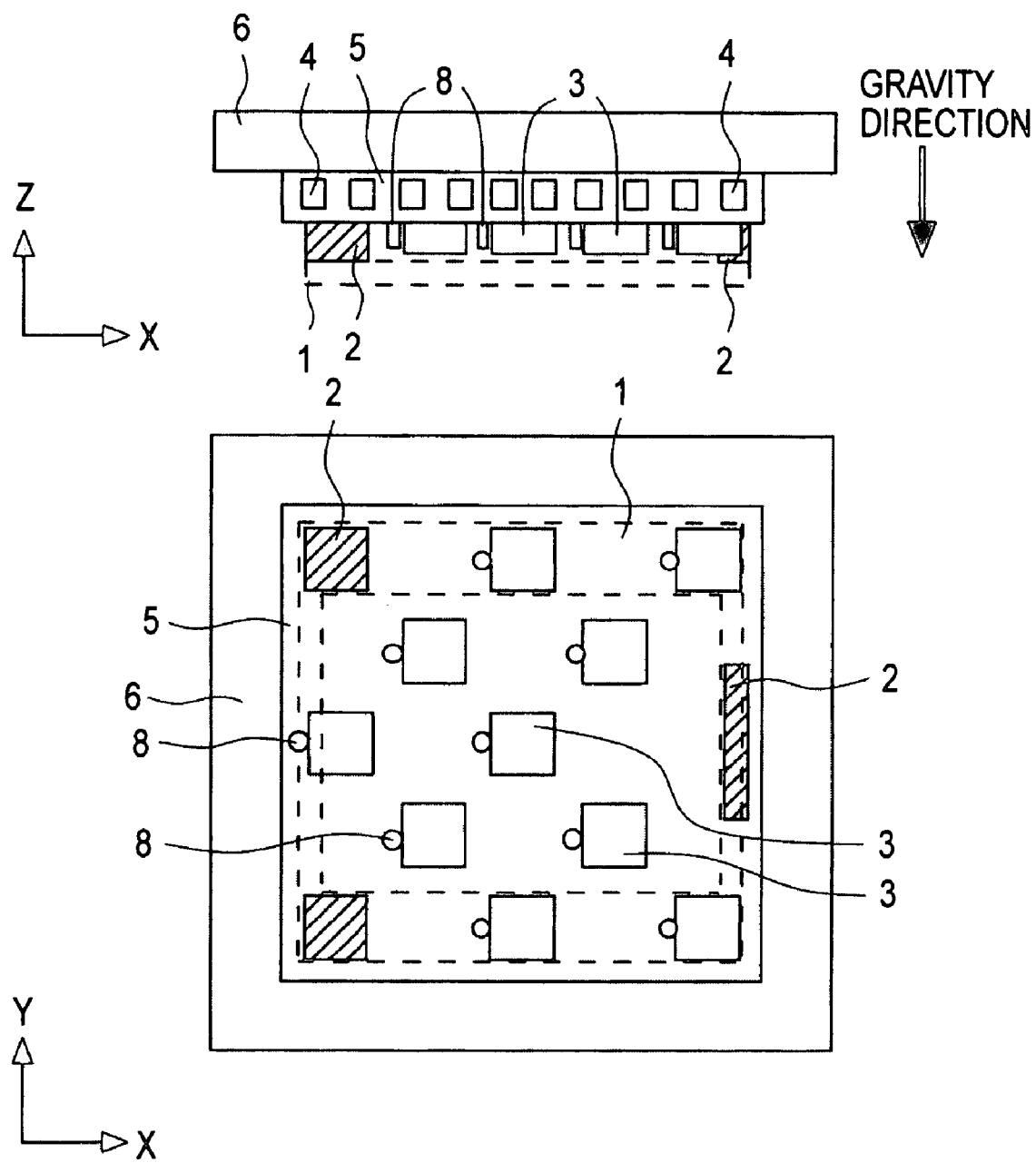
FIG. 4 is a schematic view of a general structure of a reticle chuck according to another embodiment of the present invention.

Referring now to FIG. 4, an exposure apparatus and an exposure method according to a second embodiment of the present invention will be described. In this embodiment, a contact type electrostatic chuck 2 is disposed around a reflection type reticle 1. Also, in order to meet correction of any possible shape, a plurality of (more than in the first embodiment) non-contact type electrostatic chucks are disposed. For correction with better precision, the number should be larger. Denoted at 8 is a reticle gap measuring means for measuring a gap between the bottom face of the reflection type reticle 1 and the non-contact electrostatic chuck 3. In this embodiment, for better-precision reticle correction, the gap between them is measured and the measured value is fed back to the attracting force, namely, the applied voltage.

Furthermore, in this embodiment, since plural electrostatic chucks are used, in order to avoid the complexity of constructing a temperature adjustment flowpassage, a temperature adjusting flowpassage is provided in the electrostatic chuck base 5. Since the temperature of the electrostatic chuck base 5 is controlled with this structure, heat generation in the individual electrostatic chucks 2 and 3 does not produce reticle shift due to thermal expansion. The sequence up to gripping a reflection type reticle in an actual exposure apparatus is approximately the same as that of the first embodiment, and a duplicate description will be omitted here.

With the structure described above, correction can be done with a precision even higher than that of the first embodiment.

The foregoing description has been mode with reference to an example wherein a reticle is chosen as the subject of shape correction. However, as long as the correction of deformation is based on a non-contact electrostatic attraction force, the subject is not limited to this. For example, substantially the same advantageous effects are obtainable when the invention is applied to the shape correction of a wafer or a mirror. Particularly, since the shape error of a reflection mirror used in an exposure apparatus must be controlled at a nm order, the invention is well useful for correction of the mirror surface shape, regardless that it is flat, spherical or aspherical.

In accordance with the embodiments of the present invention described hereinbefore, a reflection type reticle is supported at three points, and, therefore, any distortion of the reflection surface due to any foreign particles adhered to the reticle bottom face can be avoided. Additionally, any self-weight flexure resulting from the three-point support can be corrected by means of a non-contact electrostatic chuck or chucks, and, therefore, a defocus amount in an exposure operation can be reduced significantly. Thus, the exposure precision is improved considerably.

Furthermore, the electrostatic chuck that supports the reticle at three points is not an integral part, but, rather, it is fixed to a stage base through a plate member (chuck base) 5 made of the same material as that of the mask or of a low thermal expansion material. Therefore, with respect to thermal expansion, the material of the electrostatic chuck need not be a particular one. This leads to a reduction of cost for the production of the electrostatic chuck.

Embodiment 3

Next, an embodiment of a device manufacturing method, which uses an exposure apparatus described above, will be explained.

Figure 5:
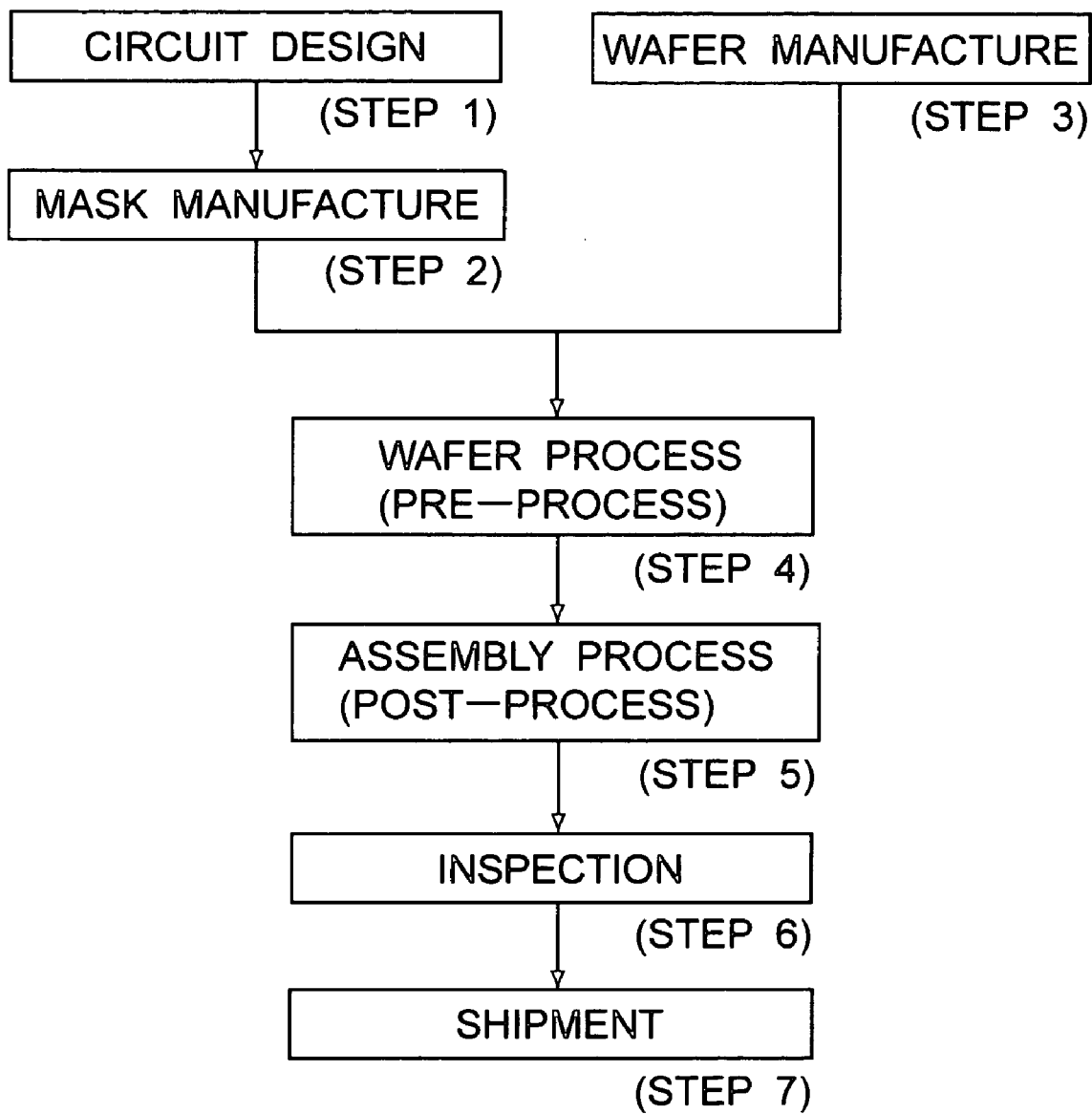
FIG. 5 is a flow chart for explaining the procedure of device manufacture.

FIG. 5 is a flow chart for explaining the procedure of manufacturing various microdevices, such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 6:
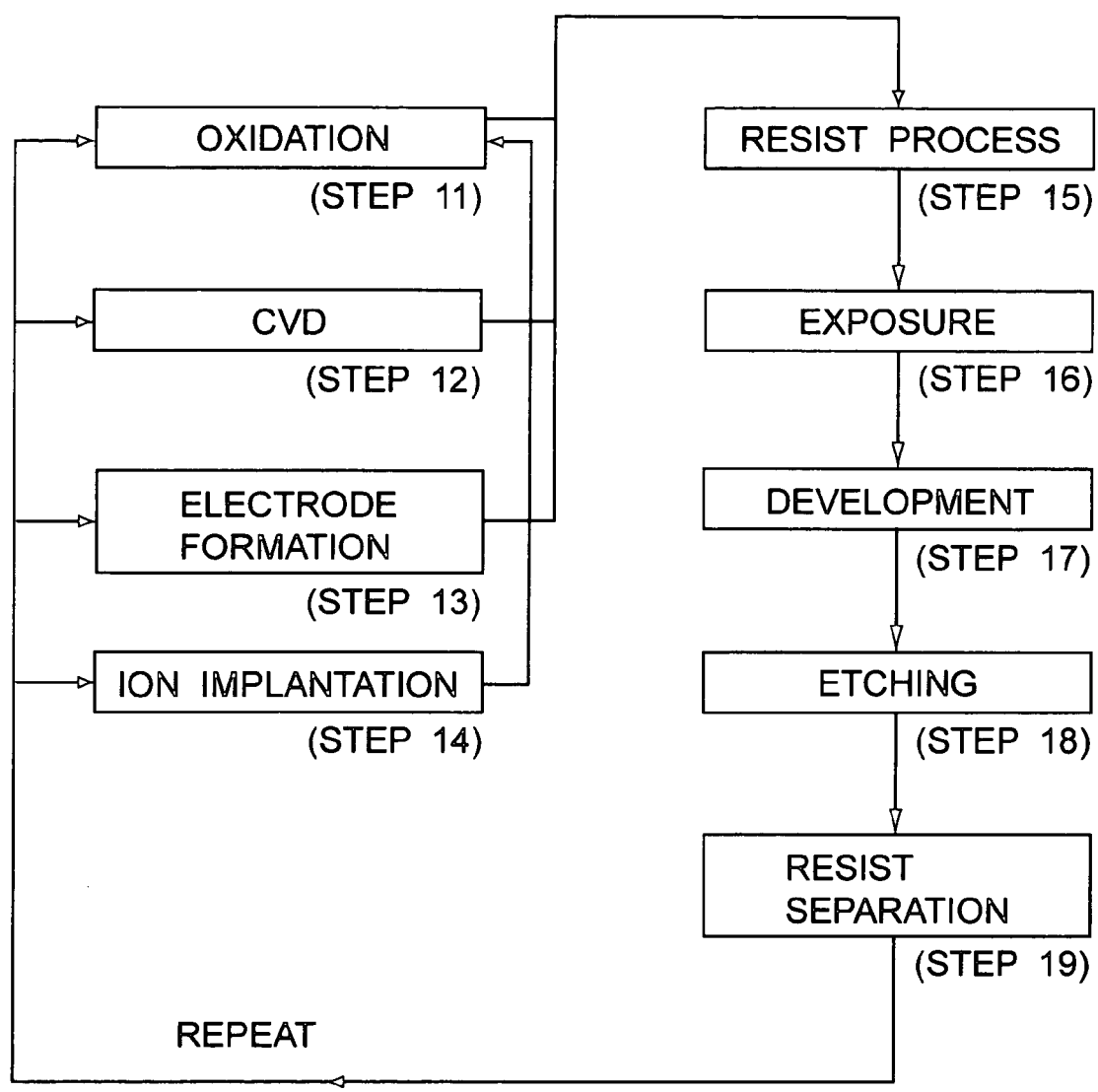
FIG. 6 is a flow chart for explaining details of a wafer process included in the procedure of FIG. 5.

FIG. 6 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured with decreased cost.

While the invention has been described, with reference to the structures disclosed herein, it is not confined to the details set forth and this application is intended to cover such modifications or changes as may come within the purposes of the improvements or the scope of the following claims.

This application claims priority from Japanese Patent Application No. 2003-388129 filed Nov. 18, 2003, which is hereby incorporated by reference.

What is claimed is:

1. A holding system for holding an object from above, against gravity, said holding system comprising:

at least one holding portion adapted to be in contact with the object, to hold the object from above;

at least one attracting portion for attracting a limited portion of the object upwardly, without contact thereto; and a gap measuring unit for measuring a gap between the object and said at least one attracting portion, wherein an attraction force of said attracting portion is controlled on the basis of the measurement made by said gap measuring unit.

2. A holding system for holding an object from above, against gravity, said holding system comprising:

at least one holding portion adapted to be in contact with the object, to hold the object from above;

at least one attracting portion for attracting a limited portion of the object upwardly, without contact thereto; and a surface measuring unit for measuring a shape of a bottom surface of the object, wherein an attraction force of said attracting portion is controlled in accordance with the measurement made by said surface measuring unit.

3. An exposure apparatus for transferring a pattern of an original onto a substrate, said apparatus comprising:

a holding system for holding an object from above, against gravity, said holding system comprising:

(i) at least one holding portion adapted to be in contact with the object, to hold the object from above; and (ii) at least one attracting portion for attracting a limited portion of the object upwardly, without contact thereto; and (iii) a surface measuring unit for measuring a shape of a bottom surface of the object held by said holding system, wherein an attraction force of said attracting portion is controlled in accordance with the measurement made by said surface measuring unit.

4. A device manufacturing method, comprising the steps of:

transferring a pattern of an original onto a substrate by use of an exposure apparatus as recited in claim 3; and developing the substrate having the pattern transferred thereto.

* * * * *